US009450427B2

(12) United States Patent
Boehm et al.

(10) Patent No.: US 9,450,427 B2
(45) Date of Patent: Sep. 20, 2016

(54) STATE OF CHARGE DETERMINATION FOR AN ELECTRICAL ACCUMULATOR

(75) Inventors: Andre Boehm, Kornwestheim (DE); Ralf Liedtke, Stuttgart (DE); Rainer Kern, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1240 days.

(21) Appl. No.: 12/737,667

(22) PCT Filed: Jul. 30, 2009

(86) PCT No.: PCT/EP2009/059894
§ 371 (c)(1),
(2), (4) Date: Apr. 21, 2011

(87) PCT Pub. No.: WO2010/015568
PCT Pub. Date: Feb. 11, 2010

(65) Prior Publication Data
US 2011/0187378 A1    Aug. 4, 2011

(30) Foreign Application Priority Data
Aug. 7, 2008    (DE) ................. 10 2008 041 103

(51) Int. Cl.
| | |
|---|---|
| *G01N 27/416* | (2006.01) |
| *H02J 7/00* | (2006.01) |
| *B60L 11/18* | (2006.01) |
| *G01R 31/36* | (2006.01) |
| *H01M 10/48* | (2006.01) |

(52) U.S. Cl.
CPC .......... *H02J 7/0021* (2013.01); *B60L 11/1861* (2013.01); *G01R 31/3637* (2013.01); *G01R 31/3658* (2013.01); *H01M 10/482* (2013.01); *H02J 2007/005* (2013.01); *Y02T 10/7005* (2013.01); *Y02T 10/705* (2013.01); *Y02T 10/7044* (2013.01)

(58) Field of Classification Search
CPC ................................... G01R 31/3648
USPC .......................................... 324/427
See application file for complete search history.

(56) References Cited

U.S. PATENT DOCUMENTS

| | | | |
|---|---|---|---|
| 5,578,915 A | 11/1996 | Crouch, Jr. et al. | |
| 6,127,806 A * | 10/2000 | Tanjo et al. ................... | 320/132 |
| 6,326,083 B1 * | 12/2001 | Yang et al. ................... | 428/429 |
| 6,356,083 B1 * | 3/2002 | Ying ............................ | 324/426 |
| 6,646,419 B1 * | 11/2003 | Ying ............................ | 320/132 |
| 2004/0119441 A1 * | 6/2004 | Koo ............................. | 320/104 |

(Continued)

FOREIGN PATENT DOCUMENTS

| | | |
|---|---|---|
| DE | 10 2006 033 629 | 1/2008 |
| JP | 2002-42906 | 2/2002 |
| JP | 2003-77548 | 3/2003 |
| JP | 2008-104289 | 5/2008 |

(Continued)

*Primary Examiner* — Richard Isla Rodas
*Assistant Examiner* — Johali Torres Ruiz
(74) *Attorney, Agent, or Firm* — Norton Rose Fulbright US LLP

(57) ABSTRACT

In a method for determining the state of charge of an electrical accumulator, individual cell voltages are recorded, and the highest and/or the lowest individual cell voltage is ascertained. A present maximum charge and/or a present minimum charge of the appertaining accumulator cell is determined using a characteristic curve and the highest and/or the lowest individual cell voltage.

18 Claims, 1 Drawing Sheet

(56) References Cited

U.S. PATENT DOCUMENTS

2005/0212486 A1 9/2005 Nakada
2008/0156551 A1* 7/2008 Kawahara et al. .......... 180/65.2

FOREIGN PATENT DOCUMENTS

| JP | 2008-148485 | 6/2008 |
|---|---|---|
| WO | WO 2007/104325 | 9/2007 |

* cited by examiner

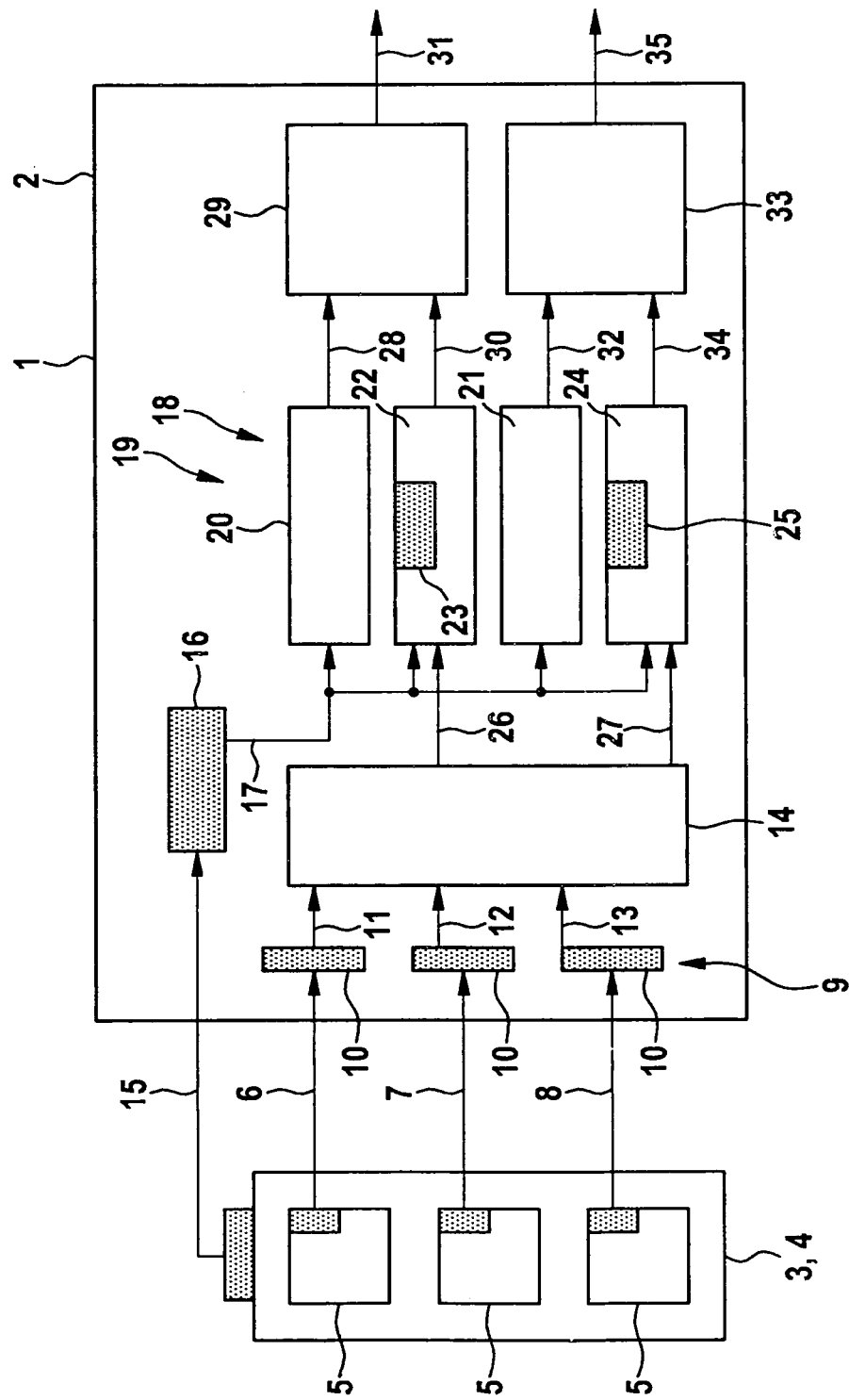

STATE OF CHARGE DETERMINATION FOR AN ELECTRICAL ACCUMULATOR

BACKGROUND OF THE INVENTION

1. Field of the Invention

The present invention relates to a method for determining the state of charge of an electrical accumulator.

2. Description of Related Art

When electrical accumulators are used in motor vehicles, especially for electrical vehicle drives, as for instance in hybrid vehicles, exact knowledge of the state of charge of the electrical accumulator is required. Both overcharge and a high level of discharge damage the electrical accumulator and shorten its service life. For determining the state of charge of the electrical accumulator, use is made of the fact that the electrical accumulator has a voltage which varies as a function of its charge. This dependency is able to be recorded accurately if the electrical accumulator is in a load-free state.

In a first known procedure, it is provided, in determining the state of charge, that one should ascertain the voltage of the electrical accumulator and determine the state of charge from this. Starting from the state of charge, in a load operation of the electrical accumulator the electric energy withdrawn from the accumulator is detected and subtracted from the state of charge. This procedure is distinguished by a simple and efficient implementation in a calculating system that requires only a small calculating effort. In spite of the recording of the state of charge of the electrical accumulator, it is possible, in this instance, that an accumulator cell is overcharged or exhaustively discharged. This occurs when the electrical accumulator is made up of a plurality of accumulator cells, and the condition of an accumulator cell deviates from the condition of the other accumulator cells, since only the overall state of the electrical accumulator is recorded.

In a second known procedure, the voltages of all the accumulator cells are recorded and evaluated individually. Furthermore, during load operation of the accumulator, the state of charge of each individual accumulator cell is calculated. Consequently, an individual state of charge is yielded for each accumulator cell. The evaluation of the voltages of all the accumulator cells leads to a considerable effort in its implementation, such as a large computing expenditure when implemented as a computer program in a control unit.

German patent application document DE 10 2006 033 629 describes a possibility for determining the state of a battery using a short-term load of the battery using a current in the charge or discharge direction. The state is ascertained in this context with the aid of the voltage response of individual cells or groups of cells.

There is a need for recording the state of charge of an electrical accumulator completely and in a simple manner, that is able to be efficiently implemented and, in the implementation as a computer program, requires only a slight computing effort.

BRIEF SUMMARY OF THE INVENTION

According to the present invention, a method is provided for determining the state of charge of an electrical accumulator, especially for a motor vehicle, having more than two accumulator cells, of which each has an electrical single cell voltage, and of which each has the same characteristics curve with respect to the load-free state, which describes the electrical charge of the accumulator cell as a function of the individual cell voltage, having the steps: recording the individual cell voltages, ascertaining the highest and/or the lowest individual cell voltages and ascertaining a present maximum charge of the appertaining accumulator cell using the characteristics curve and the highest individual cell voltage and/or a present minimum charge of the appertaining accumulator cell using the characteristics curve and the lowest individual cell voltage. "Charge" should be understood to mean the stored energy, that is, the electrical charge content of the electrical accumulator. The ascertaining of the highest and/or the lowest individual cell voltage before the evaluation of the individual cell voltages saves very many evaluation steps, compared to the related art. Consequently, there comes about an efficient implementation of the method, especially as a computer program which requires only little computing effort.

Applying the method is advantageous especially if the characteristics curve is monotonic at least from place to place, in particular if it is strictly monotonic. The electrical accumulator is preferably developed as a battery or an accumulator of a motor vehicle. The state of charge is described by one or two values, namely the maximum charge and/or the minimum charge. Using the method described, it is possible to monitor all the accumulator cells, an evaluation with respect to the state of charge of the electrical accumulator being reduced to the relevant accumulator cells. The maximum charge, in this context, indicates the charge of that accumulator cell which has the highest charge within the electrical accumulator. The minimum charge, on the other hand, indicates the charge of that accumulator cell which has the lowest charge within the electrical accumulator. Moreover, during the course of this Application, "load-free state" designates the state of the electrical accumulator in which no current, or only a small current is withdrawn from the electrical accumulator, or is carried to the electrical accumulator.

According to one refinement of the present invention it is provided that the individual cell voltages be recorded in the load-free state. In this way, a measuring error is prevented, since the characteristics curve relates to the load-free state, and in this case would generate no error or only a slight error during the evaluation. Because of the recording of the individual cell voltages in the load-free state from the characteristics curves, there thus comes about a greater accuracy in determining the state of charge.

According to one further development of the present invention it is provided that in a time interval and/or an operating interval of the accumulator, in each new load-free state, the individual cell voltages are recorded again and the maximum charge and/or the minimum charge is/are ascertained again. The renewed recording of the individual cell voltages enables determining the curve of the maximum charge and/or of the minimum charge. Consequently, there is the possibility of also recording the curve of the state of charge of the electrical accumulator and evaluating it subsequently. As the time interval, time spans may be specified from the outside or established by a control unit of the motor vehicle. That time interval is designated as operating interval, in which the electrical accumulator is put into operation, which does not mean that a current has to be withdrawn from the electrical accumulator or has to carried to it.

According to one refinement of the present invention, it is provided that, after the first load-free state, only the individual cell voltage/individual cell voltages of the accumulator cell/accumulator cells is/are recorded again, which in the first load-free state had the minimum charge and/or the maximum charge. In this way, one may also save additional evaluation steps of the method. Consequently, there comes about an even more efficient implementation of the method as a computer program, which requires an even lesser computing effort. Within the time interval and/or operating interval, it is determined only in the first load-free state which accumulator cell has the highest individual cell voltage and/or which accumulator cell has the lowest. In all subsequent load-free states, only the at least one individual cell voltage is recorded and evaluated which pertains to the accumulator cell that was determined in the first load-free state.

According to one further development of the present invention, it is provided that an accumulator's electrical load current be recorded in a load state of the accumulator. Since an evaluation of the characteristics curve outside the load-free state is able to lead to an error in the value ascertained from it, it is particularly advantageous to record the electrical load current, and especially to measure it. The load current is that current that is supplied by the electrical accumulator to a user, such as the vehicle electrical system of the motor vehicle, or is carried to the electrical accumulator from a current source for the purpose of charging it.

According to one refinement of the present invention, it is provided that the current maximum charge of the appertaining accumulator cell be calculated in the load state, using the recorded load current, its duration up to now, and the maximum charge, recorded in the last load-free state, of the accumulator cell. This makes possible monitoring the maximum charge even when the load state is present. For this purpose, the load current recorded is integrated over its time duration, the maximum charge, that was recorded in the last load-free state, being added to the result. In order to avoid sequence errors, it is particularly advantageous to determine the value of the maximum charge again at each load-free state from the characteristics curve, and then to begin the calculation again.

According to one refinement of the present invention, it is provided that the current minimum charge of the appertaining accumulator cell be calculated in the load state, using the recorded load current, its duration up to now, and the minimum charge, recorded in the last load-free state, of the accumulator cell. For this purpose, the load current recorded is integrated over its time duration, the maximum charge, that was recorded in the last load-free state, being added to the result. In order to avoid sequence errors, it is particularly advantageous to determine the value of the minimum charge again at each load-free state from the characteristics curve, and then to begin the calculation again.

According to another refinement of the present invention, it is provided that each accumulator cell have an upper charge limit and/or a lower charge limit. The upper charge limit indicates the maximum possible charging of the electric accumulator cell. If the accumulator cell, which is already at the upper charge limit, is charged further, the accumulator cell is overcharged. The lower charge limit of the accumulator cell describes the least required charging of the accumulator cell. Discharging the accumulator cell that is at the lower charge limit leads to exhaustive discharging. Exceeding the upper charging limit as well as falling below the lower charge limit may lead to damage of one or more accumulator cells, and thus of the electrical accumulator, which is why taking into account all the accumulator cells is of great advantage, particularly from a safety technology point of view.

According to yet another refinement of the present invention, it is provided that the accumulator be charged until the maximum charge of the accumulator cell is equal to the upper charge limit. The use of the maximum charge, as a reference point for the charging of the electrical accumulator, makes it possible to charge the accumulator particularly safely, since overcharging is prevented for all the accumulator cells without all the accumulator cells having to be constantly monitored with respect to their state of charge.

According to still another refinement of the present invention, it is provided that the accumulator be discharged until the minimum charge of the accumulator cell is equal to the lower charging limit. The use of the minimum charge, as a reference point for the charge of the electrical accumulator, makes it possible to discharge the accumulator particularly safely, since exhaustive discharging is prevented for all the accumulator cells without all the accumulator cells having to be constantly monitored with respect to their state of charge.

According to one refinement of the present invention, it is provided that, for a certain state of charge of the accumulator, a maximum power output be calculated, using the number of accumulator cells and the lowest individual cell voltage of a specified maximum current of the accumulator. This is provided if the accumulator cells are connected in series inside the electrical accumulator. Then the maximum available electric power is yielded by the number of accumulator cells, the lowest individual cell voltage and the maximum current. The maximum current, in this instance, comes about particularly from structural properties of the battery, the load connected to the battery and/or possible safety precautions such as electrical overload fuses. Furthermore, it is conceivable that, using the maximum power output and the minimum charge, one might calculate a minimum operating time in the load state and/or, using the maximum power output and the maximum charge, one might calculate a maximum operating time in the load state.

According to one refinement of the present invention, it is provided that, for a certain state of charge of the accumulator, its maximum power output be calculated, using the lowest individual cell voltage and a specified maximum current of the accumulator. This is provided if the accumulator cells are connected in parallel to one another inside the electrical accumulator. In this case, the maximum power output is given by the product of the lowest individual cell voltage and the specified maximum current. Here too, there is the possibility of calculating the minimum and the maximum operating time of the electrical accumulator, as was described above.

In addition, the present invention relates to a recording device for determining the state, of charge of an electrical accumulator, preferably for a motor vehicle, especially for carrying out one of the preceding methods described, the accumulator having more than two accumulator cells, which each have an individual cell voltage and which have the same characteristics curve relating to the load-free state, which describes an electrical charging of the accumulator cell as a function of the individual cell voltage, and having an individual cell voltage recording device, having a comparator device for ascertaining the highest and/or the lowest individual cell voltage, having a data memory in which the characteristics curve is stored, and a calculating unit for ascertaining a present maximum charge of the appertaining accumulator cell, using the characteristics curve and the highest individual cell voltage and/or a present minimum charge of the appertaining accumulator cell, using the characteristics curve and the lowest individual cell voltage.

In one refinement of the recording device, a current recording device is provided for a load state of the accumulator. The current recording device records, and especially measures the load current, which is carried to the accumulator or is withdrawn from the accumulator.

According to one refinement of the recording device, a charge calculation unit is provided for the load state. This calculates the current load state of the electrical accumulator in the form of the current maximum charge and/or the current minimum charge, with the aid of the load current preferably recorded by the current recording device and the last recorded maximum charge and/or the minimum charge.

According to one refinement of the recording device, it is provided that it be developed as a control unit, especially for a motor vehicle. It is conceivable that the control unit might take over additional functions for the motor vehicle. Moreover, the recording device may be assigned to a battery management system of the motor vehicle.

BRIEF DESCRIPTION OF THE DRAWING

FIG. 1 clarifies the method according to the present invention with the aid of a schematic representation of a recording device.

DETAILED DESCRIPTION OF THE INVENTION

FIG. 1 shows a schematic representation of a recording device 1 in the form of a control unit 2 of a motor vehicle that is not shown. Recording device 1 determines the state of charge of an electrical accumulator 3, which is developed as a motor vehicle battery 4. Electrical accumulator 3 has accumulator cells 5, which, each by itself, have their own individual cell voltage, that is. the electrical voltage at a single accumulator cell 5. Furthermore, each accumulator cell 5 has its own electrical charge. If accumulator cells 5 are in a load-free state, i.e. they output only little, or even no electric current, their individual cell voltage is a very good measure of their electrical charge. The relationship between the individual cell voltage and the electrical charge is described by a characteristics curve. The individual cell voltages of accumulator cells 5 are passed via arrows 6, 7 and 8 to an individual voltage recording device 9, which is made up of a plurality of recording components 10. Recording components 10 are each in connection to a comparator device 14, via an arrow 11, 12 or 13. Thus, via arrows 11, 12 and 13, comparator device 14 receives the recorded individual voltages of accumulator cells 5. The load current is carried to current recording device 16 via arrow 15. The load current recorded by current recording device 16 is passed via multiple arrow 17 both to a charge calculation unit 18 and a calculation unit 19. Charge calculation unit 18 is made up of a first integrator 20 and a second integrator 21. Calculation unit 19 is made up of a first minimum charge calculator 22 which has a data memory 23 for a characteristics curve, and of a maximum charge calculator 24, which has a data memory 25 for a characteristics curve. In addition, the lowest individual cell voltage of electrical accumulator 3 is carried to minimum charge calculator 22, via an arrow 26. In addition, the highest individual cell voltage of electrical accumulator 3 is carried to maximum charge calculator 24 from comparator device 14 via arrow 27. Integrator 20 transfers a first potential minimum charge, the one for the state of charge, to a first distinguishing device 29 via an arrow 28. Minimum charge calculator 22 transfers a second potential minimum charge, the one for the load-free state, to distinguishing device 29 via arrow 30. Finally, distinguishing device 29 outputs a minimum charge via an arrow 31. Using arrow 32, integrator 21 transfers a first potential maximum charge, the one for the load state, to a second distinguishing device 29. Furthermore, maximum charge calculator 24 transmits a second potential maximum charge, the one for the load-free state, via arrow 34. Finally, second distinguishing device 33 outputs a maximum charge via an arrow 35.

Each accumulator cell 5 of electrical accumulator 3 has an upper and a lower charging limit. If accumulator cell 5 is charged above the upper charging limit, overcharging is present, whereby accumulator cell 5 may be damaged. If accumulator cell 5 is discharged below the lower charging limit, an exhaustive discharge is present at accumulator cell 5, whereby it may also be damaged. The determination of the state of charge of electrical accumulator 3 makes it possible, during the charging of electrical accumulator 3, to take into account the upper charging limit as well as the lower charging limit. If accumulator cells 5 each have their own upper and/or lower charging limit, it is advantageous if the state of charge of electrical accumulator 3 is recorded with the aid of the electrical charge of each individual accumulator cell 5. Such differences in the charging limits may be caused, for example, by ageing effects of electrical accumulator 3. Individual voltage recording device 9 records the individual cell voltage of accumulator cells 5 and passes this individual cell voltage on to comparator device 14. Comparator device 14 compares all the individual cell voltages received, and outputs the highest individual cell voltage via arrow 27 and the lowest individual cell voltage via arrow 26. Both in minimum charge calculator 22 and in maximum charge calculator 24, with the aid of the individual cell voltage received and the characteristics curve contained in data memories 23 and 25, correspondingly the second potential minimum charge or the second potential maximum charge is ascertained for the load-free state. The characteristics curve was determined beforehand, for instance, by test series. Moreover, it is conceivable to design the characteristics curve to be temperature-dependent, and additionally, for example to connect data memories 23 and 25 to a temperature recording device, that is not shown here. In integrators 20 and 21, the electrical charge, withdrawn from accumulator cells 5, is calculated with the aid of the load currents, by integration. The value ascertained in integrator 20 may be added to a second potential minimum charge already ascertained by minimum charge calculator 22, which was ascertained at the time of the beginning of the integration. Consequently, the second potential minimum charge, the one of the load-free state, is used as the initial value for this calculation. Integrator 20 then transfers the first potential minimum charge, thus calculated, the one for the state of charge, to a first distinguishing device 29 via an arrow 28. Distinguishing device 29 checks whether the load-free state or the load state is currently present at electrical accumulator 3. If the load-free state is present, second potential minimum charge is output as minimum charge via arrow 31. If the load state is present, first potential minimum charge is output via arrow 31. In a corresponding manner, second integrator 21 cooperates with maximum charge calculator 24 and second distinguishing device 33. The latter then outputs the maximum charge via arrow 35.

The minimum charge and the maximum charge obtained in this way make it possible to charge and discharge electrical accumulator 3 in a safe manner. It is assured that none of accumulator cells 5 is overcharged or exhaustively discharged. The recording of the state of charge of electrical accumulator 3 is distinguished particularly in that only a small number of evaluation steps has to be carried out, and, at the same time all the accumulator cells 5 are monitored.

Within a certain time interval or operating interval, which may be specified by programming technique or determined by other control units or events, the possibility comes about of diminishing the number of evaluation steps even further, in that, within the time interval and/or the operating interval, all the individual cell voltages are recorded only a single time. After the first evaluation of comparator device 14, in all subsequent load-free states, only those two accumulator cells 5 are recorded by the individual voltage recording device which, during the first load-free state, had the highest and the lowest individual cell voltage.

Furthermore, the minimum and the maximum charge may be used for the ascertainment of the maximum power output of electrical accumulator 3. For the maximum power output of the electrical accumulator, the following formula may be used, provided accumulator cells 5 are connected in series with respect to one another:

$$P_{battery,discharge} = n \cdot U_{min} \cdot I.$$

The maximum power output $P_{battery,discharge}$ is thus yielded by a number n of accumulator cells 5 multiplied by the lowest individual cell voltage $U_{min}$ and a specifiable maximum current I.

If accumulator cells 5 are connected in parallel to one another, the maximum power output $P_{battery,discharge}$ is able to be calculated as follows:

$$P_{battery,discharge} = U_{min} \cdot I$$

In a corresponding way, one may also calculate the maximum power input using the highest individual cell voltage and a maximum charging current.

What is claimed is:

1. A method for operating an electrical accumulator based on a state of charge of the electrical accumulator, the electrical accumulator including a plurality of accumulator cells, the plurality of cells including at least three cells, for which a characteristics curve describes an electrical charge as a function of cell voltage in a load free state, the method comprising:
   in a first recording period, recording individual cell voltages of respective ones of the plurality of accumulator cells in the load free state;
   in a first charge determining process, at least one of:
   (A):
      (i) ascertaining which of the recorded individual cell voltages is the highest of the recorded individual cell voltages; and
      (ii) ascertaining, as a present maximum charge, a charge value identified by the characteristics curve as corresponding to a value of the ascertained highest of the recorded individual cell voltages; and
   (B):
      (i) ascertaining which of the recorded individual cell voltages is the lowest of the recorded individual cell voltages; and
      (ii) ascertaining, as a present minimum charge, a charge value identified by the characteristics curve as corresponding to a value of the ascertained lowest of the recorded individual cell voltages;
   in a second recording period, recording a respective individual cell voltage of each of only the at least one cell for which the at least one of the highest and lowest of the recorded individual cell voltages was ascertained in the first charge determining process; and
   in a second charge determining process, re-ascertaining the at least one of the present minimum charge and the present maximum charge based on the at least one respective individual cell voltage recorded in the second recording period; and
   controlling at least one of a charging of the accumulator and a discharging of the accumulator based on the at least one of the present minimum charge and the present maximum charge ascertained in the second charge determining process.

2. The method as recited in claim 1, wherein electrical load current of the accumulator is recorded in a load state of the accumulator.

3. The method as recited in claim 1, wherein each accumulator cell has at least one of an upper charge limit and a lower charge limit according to which the controlling is performed.

4. The method as recited in claim 3, wherein, in the controlling, the accumulator is charged until the charge state of at least one accumulator cell is equal to the upper charge limit of the at least one accumulator cell.

5. The method as recited in claim 3, wherein, in the controlling, the accumulator is discharged until the charge state of at least one accumulator cell is equal to the lower charge limit of the at least one accumulator cell.

6. The method as recited in claim 1, wherein the method includes the ascertaining of which of the recorded individual cell voltages is the highest of the recorded individual cell voltages, and the ascertaining, as the present maximum charge, of the charge value identified by the characteristics curve as corresponding to the value of the ascertained highest of the recorded individual cell voltages.

7. The method as recited in claim 1, wherein the method includes the ascertaining of which of the recorded individual cell voltages is the lowest of the recorded individual cell voltages, and the ascertaining, as the present minimum charge, of the charge value identified by the characteristics curve as corresponding to the value of the ascertained lowest of the recorded individual cell voltages.

8. A method for operating an electrical accumulator based on a state of charge of the electrical accumulator, the electrical accumulator including a plurality of accumulator cells for which a characteristics curve describes an electrical charge as a function of cell voltage in a load free state, the method comprising:
   recording individual cell voltages of respective ones of the plurality of accumulator cells in the load free state;
   at least one of:
   (A):
      (i) ascertaining which of the recorded individual cell voltages is the highest of the recorded individual cell voltages; and
      (ii) ascertaining, as a present maximum charge in the load free state, a charge value identified by the characteristics curve as corresponding to a value of the ascertained highest of the recorded individual cell voltages; and
   (B):
      (i) ascertaining which of the recorded individual cell voltages is the lowest of the recorded individual cell voltages; and
      (ii) ascertaining, as a present minimum charge in the load free state, a charge value identified by the characteristics curve as corresponding to a value of the ascertained lowest of the recorded individual cell voltages;
   recording electrical load current of the accumulator in a load state of the accumulator;

at least one of:
  calculating for the load state the present maximum charge of the accumulator cell for which the highest of the recorded individual cell voltages was previously ascertained in (A)(i) for the load free state, using the recorded electrical load current and the duration of the electrical load current to modify the maximum charge ascertained in (A)(ii) for the load-free state; and
  calculating for the load state the present minimum charge of the accumulator cell for which the lowest of the recorded individual cell voltages was previously ascertained in (B)(i) for the load free state, using the recorded electrical load current and the duration of the electrical load current to modify the minimum charge ascertained in (B)(ii) for the load-free state; and
controlling at least one of a charging of the accumulator and a discharging of the accumulator based on the at least one of the present minimum charge and the present maximum charge calculated for the load state.

9. The method as recited in claim 8, wherein the calculating of the present maximum charge is performed.

10. The method as recited in claim 8, wherein the calculating of the present minimum charge is performed.

11. A method for operating an electrical accumulator based on a state of charge of the electrical accumulator, the electrical accumulator including a plurality of accumulator cells for which a characteristics curve describes an electrical charge as a function of cell voltage in a load free state, the method comprising:
  recording individual cell voltages of respective ones of the plurality of accumulator cells in the load free state;
  at least one of:
    (A):
      (i) ascertaining which of the recorded individual cell voltages is the highest of the recorded individual cell voltages; and
      (ii) ascertaining, as a present maximum charge, a charge value identified by the characteristics curve as corresponding to a value of the ascertained highest of the recorded individual cell voltages; and
    (B):
      (i) ascertaining which of the recorded individual cell voltages is the lowest of the recorded individual cell voltages; and
      (ii) ascertaining, as a present minimum charge, a charge value identified by the characteristics curve as corresponding to a value of the ascertained lowest of the recorded individual cell voltages; and
  controlling at least one of a charging of the accumulator and a discharging of the accumulator based on the at least one ascertained charge;
  wherein, for a selected state of charge of the accumulator, maximum power output of the accumulator is calculated using the lowest recorded individual cell voltage and a value specified as being a maximum current that can be provided with the accumulator.

12. The method as recited in claim 11, wherein, for the selected state of charge of the accumulator, the maximum power output of the accumulator is calculated additionally using the number of accumulator cells.

13. A device for operating an electrical accumulator based on a state of charge of the electrical accumulator, the electrical accumulator including a plurality of accumulator cells for which a characteristics curve describes an electrical charge as a function of cell voltage in a load free state, the device comprising:
  an individual cell voltage recording device configured to record individual cell voltages of the plurality of accumulator cells in the load free state;
  a data memory storing the characteristics curve;
  a current-recording device for recording electrical load current of the accumulator in a load state of the accumulator; and
  circuitry configured to:
    (1) at least one of:
      (A):
        (i) ascertain which of the recorded individual cell voltages is the highest of the recorded individual cell voltages; and
        (ii) ascertain, as a present maximum charge in the load free state, a charge value identified by the characteristics curve as corresponding to a value of the ascertained highest of the recorded individual cell voltages; and
      (B):
        (i) ascertain which of the recorded individual cell voltages is the lowest of the recorded individual cell voltages; and
        (ii) ascertain, as a present minimum charge in the load free state, a charge value identified by the characteristics curve as corresponding to a value of the ascertained lowest of the recorded individual cell voltages;
    (2) at least one of:
      calculate for the load state the present maximum charge of the accumulator cell, for which the highest of the recorded individual cell voltages was previously ascertained in (A)(i) for the load free state, using the recorded electrical load current and the duration of the electrical load current to modify the maximum charge ascertained in (A)(ii) for the load-free state; and
      calculate for the load state the present minimum charge of the accumulator cell, for which the lowest of the recorded individual cell voltages was previously ascertained in (B)(i) for the load free state, using the recorded electrical load current and the duration of the electrical load current to modify the minimum charge ascertained in (B)(ii) for the load-free state; and
    (3) control at least one of a charging of the accumulator and a discharging of the accumulator based on the at least one of the present minimum charge and the present maximum charge calculated for the load state.

14. The device as recited in claim 13, further comprising:
  a charge calculation unit for determining a load state of the accumulator.

15. The device as recited in claim 13, wherein the device is configured as a control unit for a motor vehicle.

16. The device as recited in claim 13, wherein the circuitry is configured to perform the ascertainment of which of the recorded individual cell voltages is the highest of the recorded individual cell voltages, and the ascertainment, as the present maximum charge, of the charge value identified by the characteristics curve as corresponding to the value of the ascertained highest of the recorded individual cell voltages.

17. The device as recited in claim 13, wherein the circuitry is configured to perform the ascertainment of which of the recorded individual cell voltages is the lowest of the recorded individual cell voltages, and the ascertainment, as the present minimum charge, of the charge value identified by the characteristics curve as corresponding to the value of the ascertained lowest of the recorded individual cell voltages.

18. A method for operating an electrical accumulator based on a state of charge of the electrical accumulator, the electrical accumulator including a plurality of accumulator cells for which a characteristics curve describes an electrical charge as a function of cell voltage, the method comprising:

recording individual cell voltages of respective ones of the plurality of accumulator cells in a load free state;

ascertaining which of the recorded individual cell voltages is the highest of the recorded individual cell voltages;

ascertaining, as a present maximum charge in the load free state, a charge value identified by the characteristics curve as corresponding to a value of the ascertained highest of the recorded individual cell voltages;

ascertaining which of the recorded individual cell voltages is the lowest of the recorded individual cell voltages;

ascertaining, as a present minimum charge in the load free state, a charge value identified by the characteristics curve as corresponding to a value of the ascertained lowest of the recorded individual cell voltages;

recording electrical load current of the accumulator in a load state of the accumulator that follows the load free state in which the individual cell voltages were recorded;

calculating for the load state the present maximum charge of the accumulator cell, for which the highest of the recorded individual cell voltages was previously ascertained for the load free state, using the recorded electrical load current and the duration of the electrical load current to modify the maximum charge ascertained for the load-free state;

calculating for the load state the present minimum charge of the accumulator cell, for which the lowest of the recorded individual cell voltages was previously ascertained for the load free state, using the recorded electrical load current and the duration of the electrical load current to modify the minimum charge ascertained in for the load-free state; and controlling at least one of a charging of the accumulator and a discharging of the accumulator based on at least one of the present minimum charge and the present maximum charge calculated for the load state.

* * * * *